US009767703B2

(12) United States Patent
Baker et al.

(10) Patent No.: US 9,767,703 B2
(45) Date of Patent: Sep. 19, 2017

(54) PORTABLE EMERGENCY VEHICLE DEMONSTRATION SYSTEM (71) Applicant: Emergency Technology, Inc., Hudsonville, MI (US)

(72) Inventors: Douglas V. Baker, Hudsonville, MI (US); Jonathan J. Lavelette, Hudsonville, MI (US); William S. Buehler, Hudsonville, MI (US); Manuel Garza, Hudsonville, MI (US)

(73) Assignee: Emergency Technology, Inc., Hudsonville, MI (US)

( * ) Notice: Subject to any disclaimer, the term of this patent is extended or adjusted under 35 U.S.C. 154(b) by 0 days.

(21) Appl. No.: 14/961,258

(22) Filed: Dec. 7, 2015

(65) Prior Publication Data
US 2016/0159278 A1 Jun. 9, 2016

Related U.S. Application Data (60) Provisional application No. 62/089,007, filed on Dec. 8, 2014.

(51) Int. Cl.
B60Q 7/02 (2006.01)
G09B 9/00 (2006.01)
B60Q 1/26 (2006.01)
G01R 31/00 (2006.01)
G01R 31/02 (2006.01)

(52) U.S. Cl.
CPC .............. G09B 9/00 (2013.01); B60Q 1/2611 (2013.01); G01R 31/007 (2013.01); G01R 31/025 (2013.01)

(58) Field of Classification Search
CPC ... B60Q 7/00; B60Q 7/02; B60Q 1/52; B60Q 1/2611; B60Q 1/46
USPC ....... 340/463, 468, 471, 472, 331, 332, 473, 340/908
See application file for complete search history.

(56) References Cited

U.S. PATENT DOCUMENTS

| 4,131,882 | A | 12/1978 | Hollabaugh et al. |
| 4,980,668 | A | 12/1990 | Leigh-Monstevens |
| 5,296,840 | A | 3/1994 | Gieffers |
| 5,422,623 | A | 6/1995 | Bader et al. |
| 5,583,479 | A | 12/1996 | Hettich et al. |
| 5,659,289 | A | 8/1997 | Zonkoski et al. |
| 5,703,411 | A | 12/1997 | Bella et al. |
| 5,736,925 | A | 4/1998 | Knauff et al. |
| 6,020,814 | A | 2/2000 | Robert |
| 6,087,932 | A | 7/2000 | Belgard |
| 6,292,107 | B1 | 9/2001 | Yamaura et al. |
| 6,449,472 | B1 | 9/2002 | Dixit et al. |
| 8,301,108 | B2 * | 10/2012 | Naboulsi ................ G08B 21/06 340/575 |
| 2002/0030591 | A1 | 3/2002 | Paranjpe |
| 2003/0146828 | A1 | 8/2003 | Su et al. |

(Continued)

Primary Examiner — Hung T Nguyen
(74) Attorney, Agent, or Firm — McGarry Bair PC (57) ABSTRACT A portable emergency vehicle demonstration system can include an enclosure having a base and a cover mounted thereto, wherein the cover is movable between an opened position and a closed position, a set of functional warning units arranged within the enclosure, wherein the arrangement of the set of functional warning units represents an emergency vehicle, and a controller arranged within the enclosure and configured to operate the set of function warning units according to a set of predetermined signaling patterns.

24 Claims, 9 Drawing Sheets (56) References Cited

U.S. PATENT DOCUMENTS

2003/0189481 A1 10/2003 Hamid
2008/0036582 A1 2/2008 Farley
2008/0100432 A1 5/2008 Hoffman
2009/0115594 A1* 5/2009 Han .................... B60Q 1/52
                                                    340/471

\* cited by examiner

PORTABLE EMERGENCY VEHICLE DEMONSTRATION SYSTEM

CROSS-REFERENCE TO RELATED APPLICATION

This application claims the benefit of U.S. Provisional Patent Application No. 62/089,007, filed Dec. 8, 2014, which is incorporated herein by reference in its entirety.

FIELD OF THE INVENTION

This invention relates generally to electrical control systems, and more particularly for simulating the visual and audible signaling systems located on emergency vehicles, without the need for a vehicle installation.

BACKGROUND

One of the primary functions of an emergency vehicle's signaling system is to draw the attention of motorists and pedestrians to the emergency vehicle. Accomplishing this function provides safety to the driver of the emergency vehicle and approaching motorists and pedestrians. Accomplishing the safety for other drivers and pedestrians, lends to ongoing advancements in signaling technology components and systems that integrate into the emergency vehicle. The installation and coordination of the electronic visual and audible signaling devices is typically a resource-intensive process in terms of labor and materials, and typically requires permanent modifications to the emergency vehicle. The modifications to a vehicle for exterior visual or audio or data telemetry signaling technology, are usually irreversible modifications. Each signaling module, such as needed for the control of a lightbar, perimeter lights, siren, headlight flashers, antennas, etc. must be hand-wired and then programmed with configurations, flash patterns, and priorities.

Integrated wiring harnesses and control systems have been used for emergency vehicle signaling. Some examples of these types of control systems are disclosed in U.S. Pat. Nos. 5,422,623, 5,703,411, and 5,736,925 functional warning units Bader et al. U.S. Pat. No. 5,422,623 discloses an emergency signaling system for a vehicle that includes one or more signaling devices such as an emergency light located on a lightbar and a housing to enclose a first control unit necessary for delivering power to the signaling device. A second control unit remote from the first is electrically coupled to the electronics in the housing and stores and controls the signal patterns for the signaling devices. The control units are connected via a bus. Separate cabling from a battery carries power and reference ground wires to each of the control units.

Bella et al. U.S. Pat. No. 5,703,411 discloses a wiring harness and control system for emergency vehicle functional warning units directed at easy and quick installation into emergency vehicles. A control unit, mounted on the underside of the rear deck of the vehicle, couples to a user-controlled console. Branches of a wiring harness connected to the control unit are routed to the lightbar, the headlights, warning lights and grille light. The control unit contains a load shedder circuit that distributes fused power to the lighting system elements.

Dawson et al. U.S. Pat. No. 5,736,925 discloses a modular lighting control system for vehicle lighting control directed at an emergency vehicle such as an ambulance. A central processor processes commands from a user-controlled interface to route power to each of the signaling devices under the control of the central processor. The signaling devices are modular in that they may be selectively coupled to the central processor for a custom installation where the selective coupling requires a wiring harness to connect each signaling device to the central processor.

SUMMARY OF THE INVENTION

In one aspect, a portable emergency vehicle demonstration system, includes an enclosure having a base and a cover mounted thereto, wherein the cover is movable between an opened position and a closed position, a set of functional warning units arranged within the enclosure, wherein the arrangement of the set of functional warning units represents an emergency vehicle, and a controller arranged within the enclosure and configured to operate the set of function warning units according to a set of predetermined signaling patterns.

DETAILED DESCRIPTION

Figure 1:
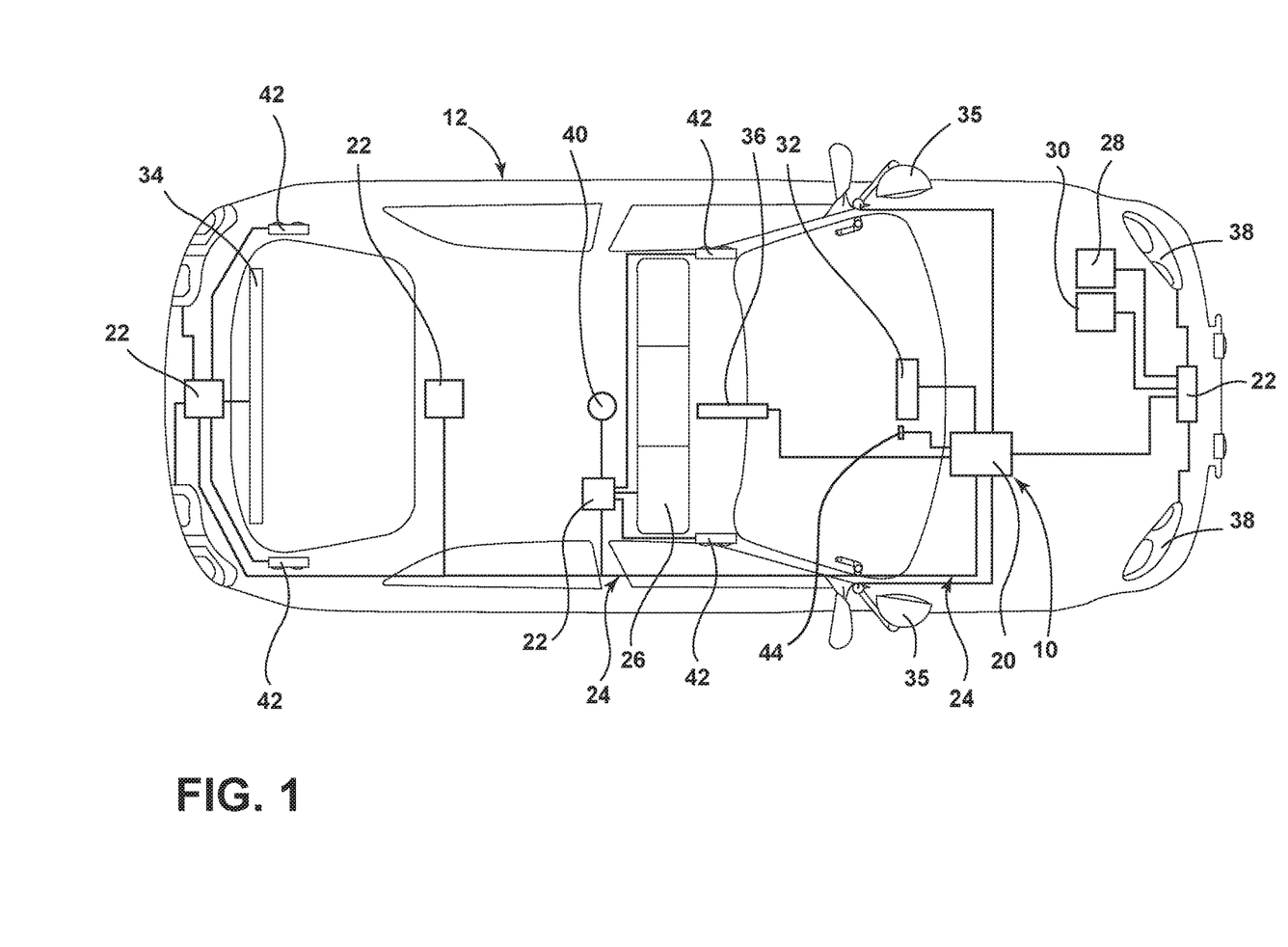
FIG. 1 is a schematic top view of an emergency vehicle with a modular, networked control system according to an embodiment of the invention.

Referring now to the drawings and to FIG. 1 in particular, an emergency vehicle 12 with a modular on-vehicle networked control system 10 is shown. The emergency vehicle 12, in addition to the standard elements of a typical vehicle, includes functional warning units to aid in specialized tasks required of the emergency vehicle and its operators. For example, one specialized task of an emergency vehicle 12 is to provide active visual and audible warnings to attract the attention of motorists and pedestrians as the emergency vehicle 12 approaches. As shown in FIG. 1, to provide active visual and audible warnings, the emergency vehicle 12 may include a variety of functional warning units such as a lightbar 26, a siren 28, a horn 30, directional lighting 34, spotlights 35, headlight flashers 38, dash lights 40 and perimeter lighting 42. Other active functional warning units may be implemented depending upon the specific requirements necessary for the particular emergency vehicle 12. Other active warning functional units may include public address systems, air horns, and load lights.

All of the emergency vehicle lights and other emergency vehicle functional warning units may be connected to the modular networked control system 10 and controlled in part by a user-interface on a control panel 32, preferably located at or near the console of the emergency vehicle 12. Alternatively, the control panel 32 may be implemented by a smart phone or tablet—either wired or wirelessly. Any device capable of providing a human-machine interface (HMI) may be used as the control panel 32 depending upon the particular implementation of the invention. Other devices for providing HMI may include a purpose-built touch panel device specifically for emergency vehicles or a multi-button console control head.

To control and coordinate the active warning devices, a modular networked control system 10 further may be integrated into the emergency vehicle 12. A modular networked control system 10 may further include a central controller 20 communicatively coupled to one or more remote controllers 22 via a network connection. As shown in FIG. 1 the network connection may preferably be a Local Interconnect Network (LIN) 24. Other networks may be implemented, for example, a Controller Area Network (CAN) or a wireless local area network (WLAN).

The LIN 24 is a broadcast serial network connecting a single master node with one or more slave nodes. All messages on the LIN 24 are initiated by the master node with a single slave node replying to a given transmitted message. Communications across the LIN 24 may be carried at a 19.2 kbits/s data rate though other data rates may be implemented. The master and slave nodes are typically implemented as a microcontroller but may alternatively be implemented as application-specific integrated circuits (ASICs).

Integrated into the central controller 20, the master node of the LIN 24 initiates communications with the slave nodes that are integrated into each remote controller 22. The network topology, or organizational hierarchy of the interconnected nodes on the LIN 24, may be any network that enables communications between the central controller 20 and the remote controllers 22. In one implementation, the network topology is a star network where all the slave nodes in the remote controllers 22 are directly connected to the master node in the central controller 20. However, other network topologies such as a tree topology may be implemented to allow for remote controllers 22 to be daisy-chained such that some of the slave nodes of the remote controllers 22 are communicatively coupled to the central controller 20 through the slave nodes of other remote controllers 22.

The emergency vehicle functional warning units controlled by the modular networked control system 10 may be connected to the outputs of either the central controller 20 or any of the remote controllers 22. Functional warning units such as the lightbar 26, siren 28 and horn 30 may preferably be directly connected to the central controller 20 whereas the directional light 34 or the headlight flashers 38 may be directly connected to one of the remote controllers 22. The interoperability provided by the modular networked control system 10 enables emergency vehicle functional warning units to be connected to the controller deemed most accessible. This system enables short cable lengths to the controlled emergency vehicle functional warning units to boost drive intensity, simplify and speed installation, and reduce harness weight and cost.

The emergency vehicle functional warning units operably controlled by the modular networked control system 10 may not be limited to visual and audible warning devices. For example, a gun rack 36 may be selectively locked and unlocked by a solenoid connected to either the central controller 20 or a remote controller 22. Any 12-volt accessory socket 44 or device may be operably controlled in the same manner; energized or de-energized according to an output of either the central controller 20 or a remote controller 22.

Regardless of the particular network topology of the LIN 24, the configuration of the central controller 20 and the remote controllers 22 on the LIN 24 asserts a modular design whereby additional remote controllers 22 may be plugged into the network without reconfiguration of previously installed elements of the networked system, particularly the central controller 20. Installation of additional remote controllers 22 requires a single power connection to be run from a power source to the additional remote controller 22. Additional emergency vehicle functional warning units may connected to the additional remote controller 22 without an additional wiring harness being run back to the central controller 24. In one aspect, the ready addition of new remote controllers 22 and the ability to plug into the networked system provides for a highly scalable implementation.

Figure 2:
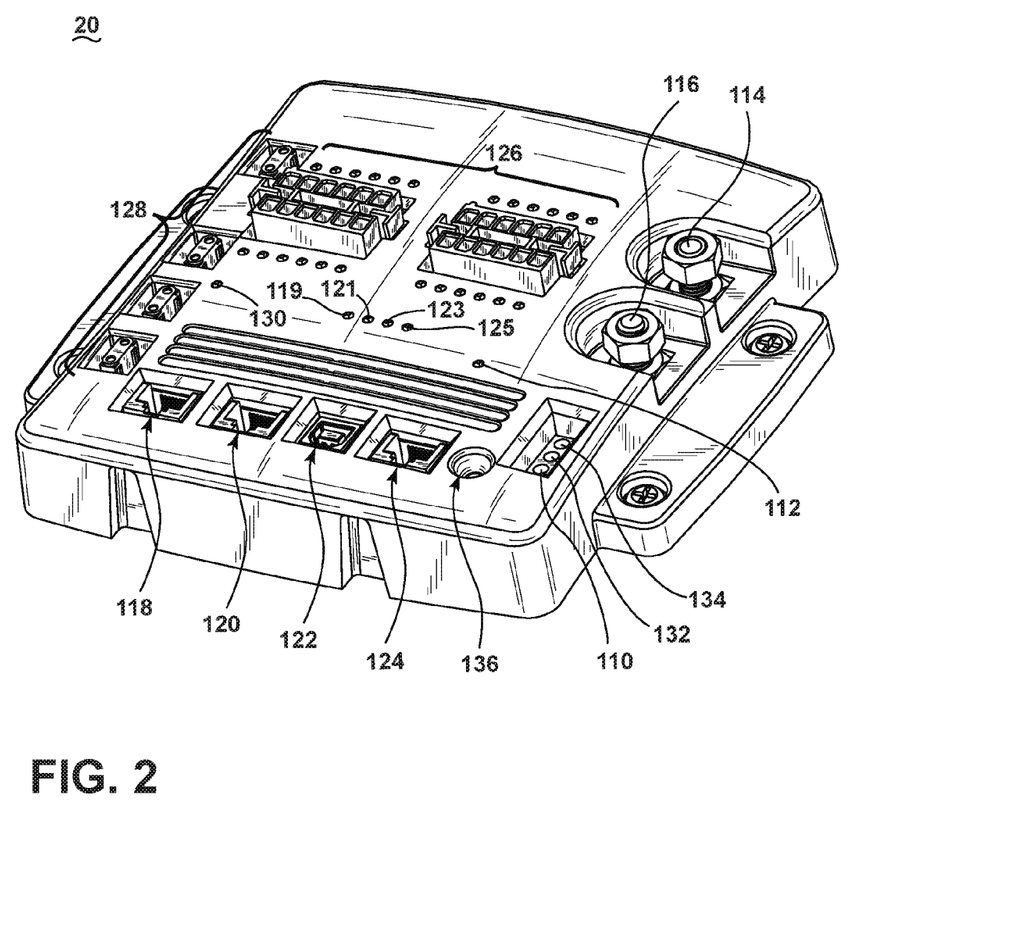
FIG. 2 is an isolated perspective view of a central controller used in the control system of FIG. 1.

Referring now to FIG. 2, the central controller 20 may now be described. The central controller 20 is an electrical device that includes a number of electrical connections for providing energy to remotely connected devices including directly connected emergency vehicle functional warning units. Additionally, the central controller 20 provides communication to remote controllers 22 coupled to the remote LIN communications port 110. A LIN status light-emitting diode (LED) 112 may be provided for visual confirmation of the status of the network connection.

Power may be provided to the central controller 20 by power input connections further including, for example, a +12 Vdc connection 114 and a chassis ground connection 116. Preferably, the power input connections are further connected to a car battery, though other power sources may be considered such as an alternator or a generator.

In addition to the LIN communications port 110, other communications ports may be implemented. For example, a lightbar communications port 118 may provide a direct communications channel between the lightbar 26 and the central controller 20. Using this port, the lightbar 26 may directly communicate with the central controller 20. Likewise, a siren communications port 124 may be implemented. Both the lightbar communications port 118 and the siren communications port 124 may be provided in tandem with status LEDs 119, 125 for visual confirmation of the status of the lightbar 26 and the siren 28.

The control panel 32 may be connected to the central controller 20 by the control panel port 120. As previously described, the control panel 32 may provide an HMI for connecting a user to the signaling system for operation of the emergency vehicle functional warning units. A control panel status LED 121 may provide a visual indication as to the status of the control panel 32.

A power status and/or fault LED 130 may be provided to visually indicate the overall status of the central controller 20. Alternatively, the power status and/or fault LED 130 may indicate a system fault. For example, the power status and/or fault LED 130 may flash according to a pattern that indicates a diagnostic code in the event of a fault.

A plurality of switched power outputs 126 each with a status LED allow for a number of additional direct connections between the central controller 20 and emergency vehicle functional warning units. A microprocessor in the central controller 20 may selectively power any of the switched power outputs 126 according to the design of a particular signaling pattern or user-selected state by way of the control panel 32. Other inputs to the system including those connected directly to the remote controllers 22 and user-initiated inputs may also determine in part the signaling patterns. While any number of switched power outputs 126 may be integrated into the central controller 20, in one preferred implementation, the central controller 20 includes twenty switched power outputs.

A plurality of constant power outputs 130 each with a status LED allow for a number of additional direct connections between the central controller 20 and emergency vehicle functional warning units that need to always have access to power. For example, a police cruiser may have a radio that is manually switched at the console of the vehicle. While any number of constant power outputs 130 may be integrated into the central controller 20, in one preferred implementation, the central controller 20 includes four constant power outputs.

Additional inputs to the central controller 20 beyond the control panel communications port 120 include an ignition input 132, an auxiliary input 134 and the current state of the emergency functional warning units. These additional inputs provide alternative conditions such that the microcontroller may initiate signaling patterns either by communications across the LIN 24 or to directly connected switched outputs 126 in response to the current state of, for example, the ignition switch or any of the emergency functional warning units.

Figure 3:
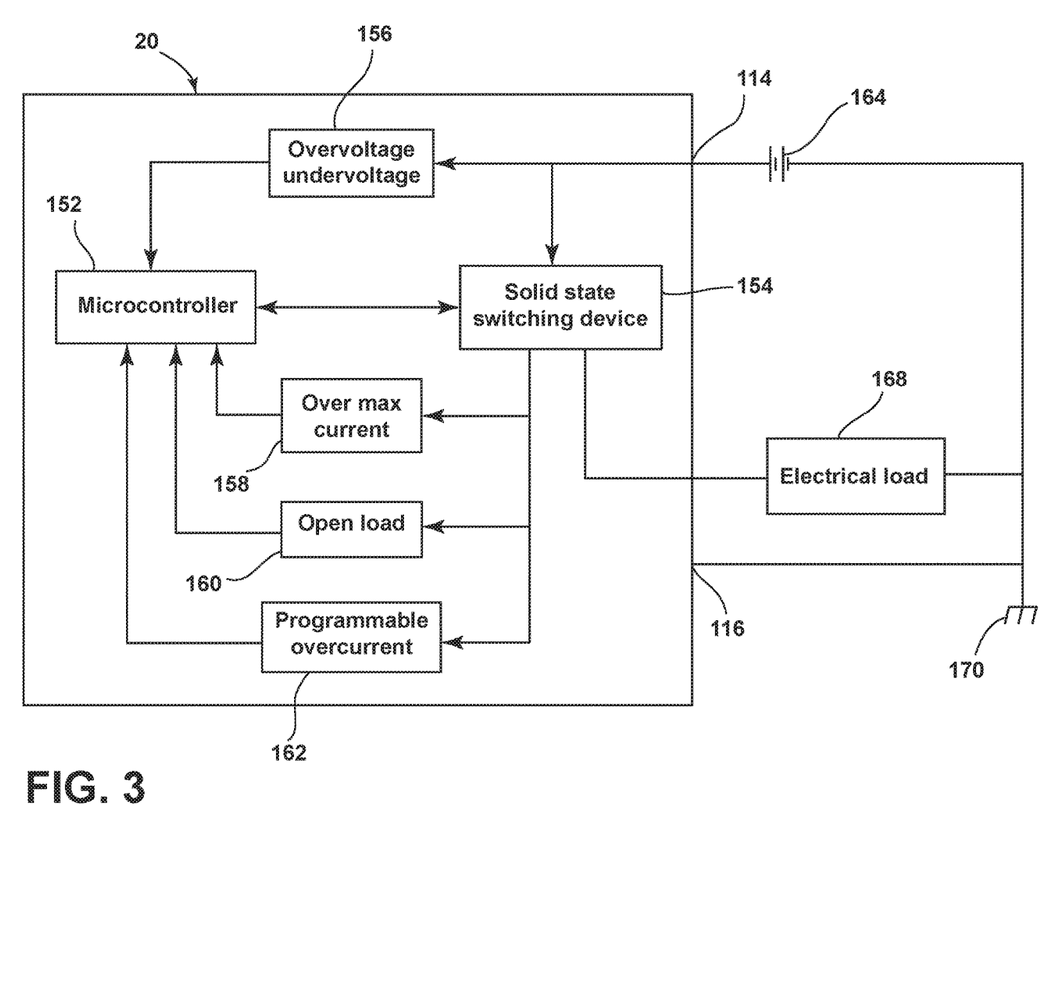
FIG. 3 is a schematic electrical view of the central controller of FIG. 2.

Referring now to FIG. 3, the central controller 20 may preferably include solid-state electronic components including a microprocessor 152 for processing user inputs, connecting and managing the network and network communications and coordinating the warning signals such as flashing patterns of the relevant emergency vehicle functional warning units. Coupling the microprocessor 152 to both a power source 164 such as a 12 Vdc battery, and the electrical load 168, a solid-state switching device 154 may enable protective and diagnostic functions by provision of overvoltage and undervoltage detection 156, over maximum current detection 158, open load detection 160 and programmable overcurrent detection 162. The electrical load may further include both the inputs to the central controller 20 and the powered outputs such as the emergency vehicle functional warning units controlled by the central controller 20 and may be connected to chassis ground 170 as necessitated by the particular implementation.

The overvoltage and undervoltage detection 156 may detect when the voltage supplied to the central controller 20 is above or below the voltage range at which the central controller 20 is designed to operate such as may occur during a power surge. The over maximum current detection 158 may similarly detect when the current exceeds a specific current value such as may occur in a short circuit. The open load detection 160 may detect a no-load impedance indicative of an electrical disconnect between the central controller 20 and the electrical load 168.

The programmable overcurrent detection 162 may detect the presence of excess or larger than intended electric current along a conductor in the solid-state switching device 154 often indicative of a short circuit or an excessive electrical load. In contrast to the over maximum current detection 158, the threshold used to determine whether the detected current level is excessive may be dynamic such that a programmable threshold may be implemented and adjusted based in part upon the electrical characteristics of the particular electrical load coupled to the controller. The particular emergency vehicle functional warning units connected to the central controller 20 may characterize the electrical load and its corresponding electrical characteristics.

By integrating a solid-state switching device 154 into the central controller 20 or a remote controller 22, the overall reliability of the emergency vehicle control system is improved without the need for electromechanically operated relays or fuses. For example, the overcurrent detection features may eliminate the need for a fused circuit element, thereby eliminating the need for manual replacement of a fuse to restore operation of the emergency vehicle modular networked control system in the event of a system fault.

To communicate across the LIN 24, the central controller 20 may initiate communication with one or more of the remote controllers 22 according to a communications protocol that defines the format and syntax of the communicated data as well as the rules for data exchange between nodes of the network. According to the communications protocol of the present invention, the central controller 20 may initially transmit a data packet. The data packet may be received by every remote controller 22 on the LIN 24 and, according to an instruction embedded in the data packet, a specific remote controller 22 may reply with a second data packet to the central controller 20. The combination of the initial data packet transmitted by the central controller 20 and the response packet transmitted by the indicated remote controller 22 may indicate a data frame. The time required to complete a data frame dictates the refresh rate of the network communication. In a preferred embodiment of the modular networked control system 10, the refresh rate is approximately 10 milliseconds (ms) though other refresh rates may be implemented depending upon the design goals of a particular system.

Figure 4:
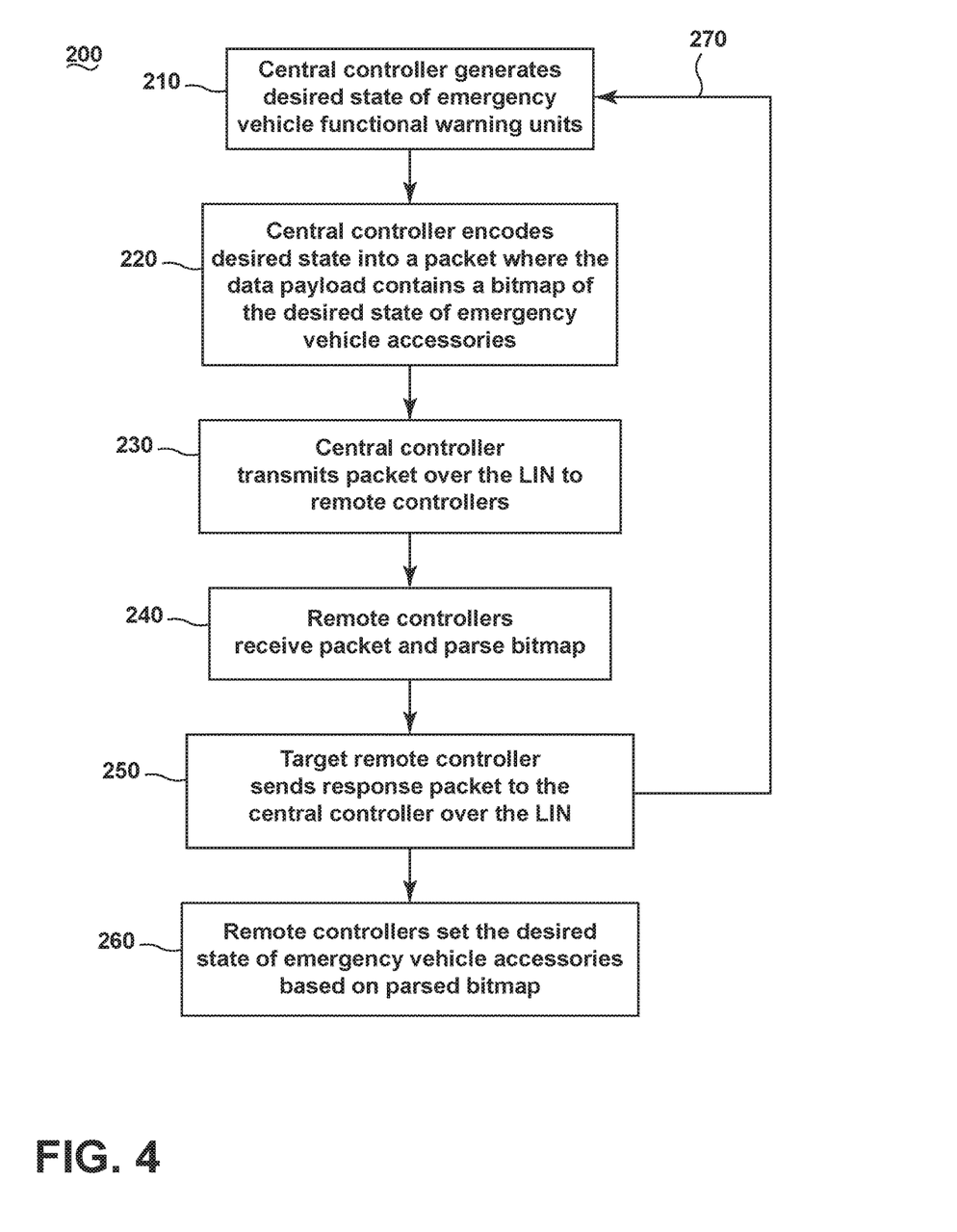
FIG. 4 is a flowchart showing communication between the central controller and the remote controllers for setting the desired state of emergency vehicle functional warning units according to an embodiment of the invention.

Referring now to FIG. 4, the method of communicating the desired state of the emergency vehicle functional warning units 200 from the central controller 20 to the remote controllers 22 by the communication protocol according to the present invention will now be described. At the start of each data frame at step 210, the central controller 20 may generate the desired state of the emergency vehicle functional warning units connected to the central controller 20 by way of the LIN 24. The central controller may then encode at step 220 the desired state of the emergency vehicle functional warning units; that is, ON/OFF or powered/not powered, into the data payload of the packet as will be described below. The encoding of the desired state may be a bitmapped representation where each emergency vehicle functional warning unit's state will be assigned a 0 or 1. Then at step 230, the central controller 20 may transmit the packet over the LIN 24 to the remote controllers 22. At step 240, each of the remote controllers 22 may receive the packet and, generally, parse the packet and, more particularly, parse the bitmap representation of the desired state of the emergency vehicle functional warning units under the control of the remote controller 22. A target remote controller 22 may generate and send a response packet including an acknowledgement to the central controller 20 over the LIN 24 at step 250. Then, at step 260, the remote controllers 22 may set the current state of the emergency vehicle functional warning units based on the desired state encoded in the parsed bitmap. At 270, the response packet may be sent from the target remote controller 22 and received by the central controller 20 designating the completion of the current data frame and the beginning of the next data frame where the process may be repeated.

Each data packet formed according to the communications protocol may consist of a first byte that encodes the length of the packet in bytes, a second byte that encodes the target of the packet and the type of data encoded in the payload. The next sequence of bytes may encode the payload or actual data encoded in the packet. The last two bytes of the packet may encode a cyclic redundancy check (CRC). The CRC is a well-known error-detecting code used in digital networks to detect accidental changes to raw data and need not be described in more detail here.

Table 1 presents a tabular description of the structure of first byte of the communications protocol of the present invention. The first byte may encode the length of the packet in bytes.

TABLE 1

Packet Length

| Bit 7 | Bit 6 | Bit 5 | Bit 4 | Bit 3 | Bit 2 | Bit 1 | Bit 0 |
| --- | --- | --- | --- | --- | --- | --- | --- |

Encodes the total number of bytes in the packet

Table 2 presents a tabular description of the structure of the second byte of the communications protocol of the present invention. The target bit may be set to indicate the packet is being sent from the central controller 20 to one of the remote controllers 22 or being sent from one of the remote controllers 22 to the central controller 20. The module identifier in the final three bits may encode which remote controller 22 is transmitting or being targeted. The type or function of the data encoded in the payload may be described by the three function bits of the packet header.

TABLE 2

Packet Header

| Bit 7 | Bit 6 | Bit 5 | Bit 4 | Bit 3 | Bit 2 | Bit 1 | Bit 0 |
| --- | --- | --- | --- | --- | --- | --- | --- |
| Target | Function | | | | Module Identifier | | |

Table 3 presents a tabular description of the packet structure of the communications protocol of the present invention. As described above, the packet encodes the length of the packet in bytes, the target and function of the packet, the data payload for the encoded function in a variable number of bytes and the CRC for detecting errors in the transmitted packet.

TABLE 3

| Packet Length | Packet Header | Payload | CRC |
| --- | --- | --- | --- |
| 1 byte | 1 byte | Variable bytes | 2 bytes |

One encoded function indicates the data payload is the output enabled state of every emergency vehicle functional warning unit connected to the modular networked signaling system. The data payload maps a single bit representative of a desired ON/OFF state for each emergency vehicle functional warning unit. In this way, a single output packet encodes the desired state of every emergency vehicle functional warning unit connected to the networked signaling system in a bitmap. For a network with five remote controllers 24 where each remote controller 24 is coupled to ten emergency vehicle functional warning units, information for all 50 outputs is encoded in less than seven bytes of data. Further, all of the remote controllers 24 may update the current state of each emergency vehicle functional warning unit based on that data. Therefore, all system outputs may update at approximately the refresh rate of the data frame of the communications protocol. With a preferred implementation, the signaling system may update at approximately a rate of once every 10 ms. However, the refresh rate may ideally be selected to achieve the fastest output update rate and lowest input latency.

As described above, the target remote controller 22 may send a response packet to the central controller 20 over the LIN 24 in the data frame. The response packet may act as an acknowledgment of the data packet sent by the central controller 20. The data payload of the response packet may encode the current state of additional system inputs that are directly connected to the target remote controller 22. The state of the additional inputs may be encoded as one of many possible states. For example, an analog voltage level of an additional input may be digitized and encoded into the data payload of the response packet. In this way, the additional inputs connected to each remote controller 22 may be discretized and subject to digital signal processing techniques including, but not limited to, digital filtering. Other processing techniques including the use of programmable thresholds may be used to process the encoded signals indicative of the state of the additional inputs.

Additionally, the data payload of the response packet may encode faults detected on any of the emergency vehicle functional warning units directly connected to the target remote controller 22. Other ancillary data may be transmitted back to the central controller 20 in the data payload of the response packet. For example, the temperature of the remote controller 22 may be sensed and then encoded into the data payload of the response packet. Any number of operational characteristics of the remote controllers 22, the emergency vehicle functional warning units or even the emergency vehicle may be sensed and then encoded into the data payload of the response packet.

By bitmap encoding the desired state of every emergency vehicle functional warning unit on the modular networked control system 10, the central controller 20 may synchronize all of the devices, particularly the visual and audible warning devices such as the lightbar 26, siren 28 and perimeter lighting 42 to establish any coordinated signaling pattern desired or required for the particular emergency vehicle 12. In this way, flash patterns for each lighting device may be encoded into the central controller 20 and may be easily reconfigurable. New patterns may be uploaded into the central controller 20 to adapt to flashing pattern requirements that may differ across regions.

Figure 5:
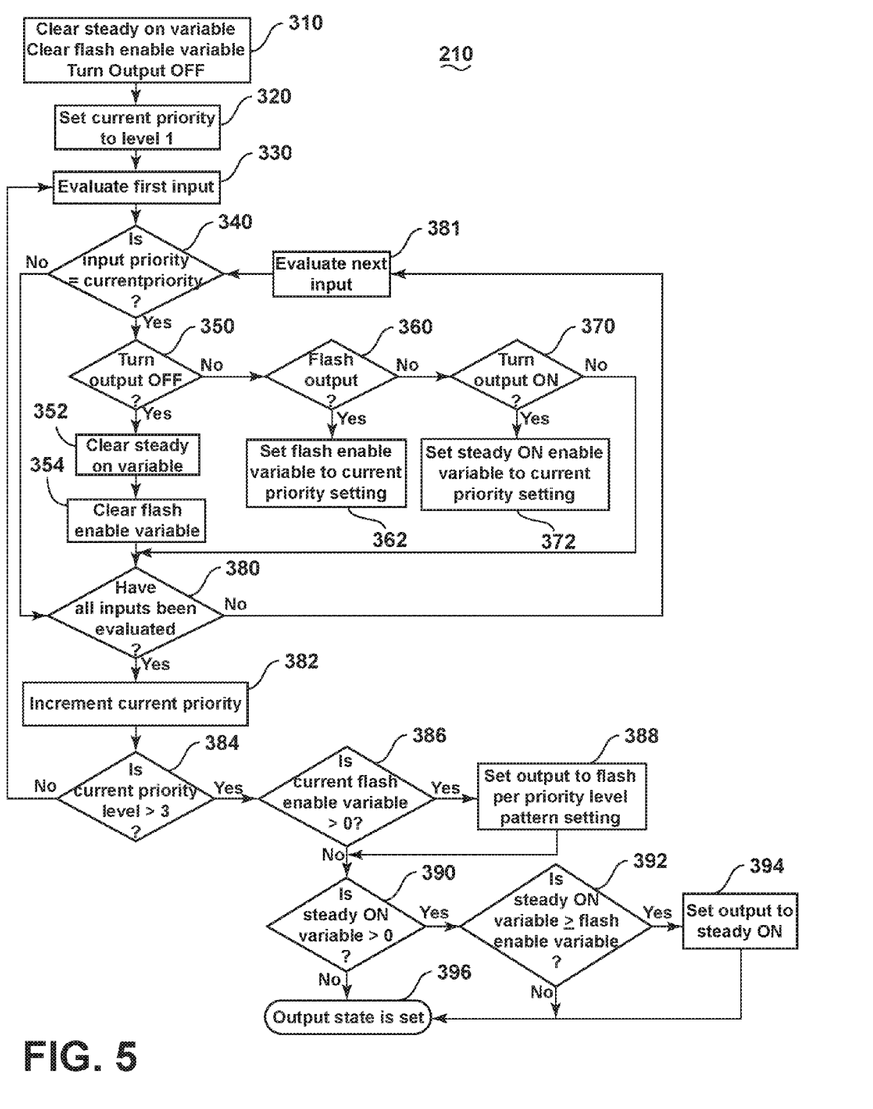
FIG. 5 is a flowchart showing a method the central controller may use to generate the desired state of emergency vehicle functional warning units functional warning units according to an embodiment of the invention.

As previously discussed, at the start of each data frame at step 210, the central controller 20 may generate the desired state of the emergency vehicle functional warning units connected to the central controller 20 by way of the LIN 24. Referring now to FIG. 5, a method for generating the state of emergency vehicle functional warning units may now be described. The method may preferably be implemented and executed by the microcontroller 152 in the central controller 20 though other controlling elements may be implemented, for example, a software-based controller loaded into a personal computer or mobile device connected to the central controller 20. Initially, at step 310, the microcontroller 152 may clear the state of conditional variables referred to as the "steady on" and "flash enable" variables. As described below, these variables may encode desired behaviors of the emergency vehicles functional warning units and may be set based in part on the state of various inputs.

At step 320, the microcontroller 152 may set the current priority to an initial level such as level one. Each input to the emergency vehicle modular networked control system may be assigned a priority, for example, from one to three and the input may have one of two input states; ON or OFF, and may indicate one of three states for the output; ON, OFF or FLASH. The microprocessor 152 may then use the priority level of each input to order the processing of the inputs to determine the output state of the emergency vehicle functional warning unit. The microprocessor may evaluate the first input at step 330 and may determine if the input's priority is the same as the current priority at step 340. If the input's priority is the same as the current priority then at step 350, the microprocessor 152 may determine if the output state should be turned OFF based upon the state of the input. If the output state, as determined by the input state, is not OFF, then at step 360, the microprocessor 152 may determine if the output state should be set to FLASH based upon the input. If, based upon the input state, the output is not FLASH, then at step 370, the microprocessor 152 may determine if the output state should be turned ON based upon the state of the input.

Based upon the decisions at steps 350, 360 and 370, the state of the steady on and flash enable variables may be updated. If the microprocessor, at step 350 determines that the output state should be turned OFF based upon the state of the input, then at step 352, the steady on variable may be cleared and at step 354, the flash enable variable may be cleared. If the microprocessor 152 determines that the output state should be set to FLASH based upon the state of the input, then, at step 362, the flash enable variable may be set to the current priority level, that is the priority level of the input. If the microprocessor 152 determines that the output state should be turned ON based upon the state of the input, then, at step 372, the steady on variable may be set to the current priority level that is the priority level of the input.

If, at step 340, the input's priority is not the same as the current priority or after evaluating the input's state and updating the relevant variables at any of steps 354, 362, 372 and 370, the microprocessor 152 may determine if all inputs to the emergency vehicle control system have been evaluated. If not, then at step 381, the microprocessor 152 may evaluate the next input and proceed to the evaluating steps starting with determining if the input's priority is the same as the current priority at step 340. Upon evaluation of all the inputs, the microprocessor 152 may increment the current priority at step 382. The microprocessor, at step 384 may then determine if the current priority level exceeds the highest priority level of the system, for example a priority level greater than three. If the microprocessor determines at step 384 that the current priority level is less than or equal to the maximum priority level for the system, the evaluation of the inputs starting with evaluation of the first input at step 330 may be repeated for the current priority level.

When the microprocessor 152 determines at step 384 that the current priority level exceeds the highest priority level of the system, the microprocessor 152 may evaluate the flash enable variable at step 386. If the flash enable variable is greater than zero, the microprocessor 152, at step 388, may set the output state of the emergency vehicle functional warning unit to flash per the flash pattern associated with the priority level encoded in the flash enable variable. If, at step 386, the flash enable variable is zero or after the output state of the emergency vehicle functional warning unit is set to flash at step 388, the microprocessor 152, at step 390, may determine if the steady on variable is greater than zero. If the steady on variable is greater than zero, then at step 392, the microprocessor 152, may compare the values of the steady on and flash enable variables. If the steady on variable has the same or a higher value than the flash enable variable, then at step 394, the output state of the emergency vehicle functional warning unit may be set to ON.

As described, the microprocessor 152 may determine the output state of the emergency vehicle functional warning units based in part on the activated input with the highest priority. Table 4 presents an example set of inputs with their output state and priority level. Table 5 present four example scenarios to demonstrate the relationship between the output state and the priority of the inputs. Scenario 1 results in a FLASH output state because input three is ON and when input three is ON and has the highest priority of the inputs in the ON state, it directs an output state to be set to FLASH. Scenario 2 results in a FLASH output state because input six with a priority level of three is ON and set to FLASH. Scenario 3 results in an OFF output state because input five with a priority level two is ON and directs an output of an OFF state. Scenario 4 results in a FLASH output state because input three with a priority level two is ON and set direct an output to a FLASH output state.

TABLE 4

|  | Input Number | | | | | | | | |
| --- | --- | --- | --- | --- | --- | --- | --- | --- | --- |
|  | 1 | 2 | 3 | 4 | 5 | 6 | 7 | 8 | 9 |
| Output state | ON | OFF | FLASH | ON | OFF | FLASH | ON | OFF | FLASH |
| Priority Level | 1 | 1 | 2 | 2 | 2 | 3 | 3 | 1 | 1 |

TABLE 5

|  | Input Number | | | | | | | | |
| --- | --- | --- | --- | --- | --- | --- | --- | --- | --- |
|  | 1 | 2 | 3 | 4 | 5 | 6 | 7 | 8 | 9 |
| Scenario 1—Resulting Output FLASH | | | | | | | | | |
| Input State | ON | ON | ON | OFF | OFF | OFF | OFF | OFF | OFF |
| Scenario 2—Resulting Output FLASH | | | | | | | | | |
| Input State | ON | ON | ON | ON | ON | ON | OFF | ON | ON |

TABLE 5-continued

| | Input Number | | | | | | | | |
|---|---|---|---|---|---|---|---|---|---|
| | 1 | 2 | 3 | 4 | 5 | 6 | 7 | 8 | 9 |
| Scenario 3—Resulting Output OFF | | | | | | | | | |
| Input State | ON | ON | OFF | OFF | ON | OFF | OFF | OFF | OFF |
| Scenario 4—Resulting Output FLASH | | | | | | | | | |
| Input State | ON | OFF | ON | OFF | OFF | OFF | OFF | ON | OFF |

If the value of the steady on variable at step 390 is greater than zero and also greater than the flash enable variable then the output is encoded to ON at step 394. The microprocessor 152 may then encode the output state at step 396 for the data payload of the packet to be sent by the central processor 20 in step 220 of the communication protocol described in FIG. 4. As previously described, the encoding scheme for output states encoded in the data payload of the packet to be sent via the LIN 24 to the remote controllers 22 allows for bitmapped encoding of ON/OFF states. When an output state at step 396 is set to FLASH, the microprocessor 152 may further encode the output state by an additional process that encodes the flash pattern for the output based on the priority level of the relevant input. The microprocessor at step 392 may determine if a particular FLASH output state should be encoded into the data payload of a packet as ON or OFF based on a timed sequence of steps that determine the flash pattern. In this way, the flash pattern is a series of instructions in the microprocessor that may encode a flash pattern as a predetermined sequence of ON and OFF states as a sequence output. For example, a FLASH output may result in one set of emergency vehicle functional warning units being cycled from ON to OFF every 5 data frames while a second set of emergency vehicles functional warning units are cycled from ON to OFF for 5 data frames and then from OFF to ON for 2 data frames. Consequently, the temporal resolution for the generated flash patterns is synchronized with the data frame rate, for example 10 ms. Therefore, the central controller 20 may simply send an ON or OFF value to the remote controller 22 for each output emergency vehicle functional warning unit when in FLASH mode.

The central controller 20 may have multiple flash patterns programmed into the microprocessor 152. The method to generate the output states may be applied to determine the output state of each emergency vehicle functional warning unit individually or en masse depending upon the desired implementation. Additionally, the method may be triggered by one of many conditions, including the detection of a changed state of an input. Other triggers may include those based on timers or other external sensors. The system and method described above may include the capacity to handle complex input matrix triggers. For example, the system may handle multiple inputs by processing Boolean logic statements assembled based upon the state of the system and the set of inputs to the system.

Figure 6:
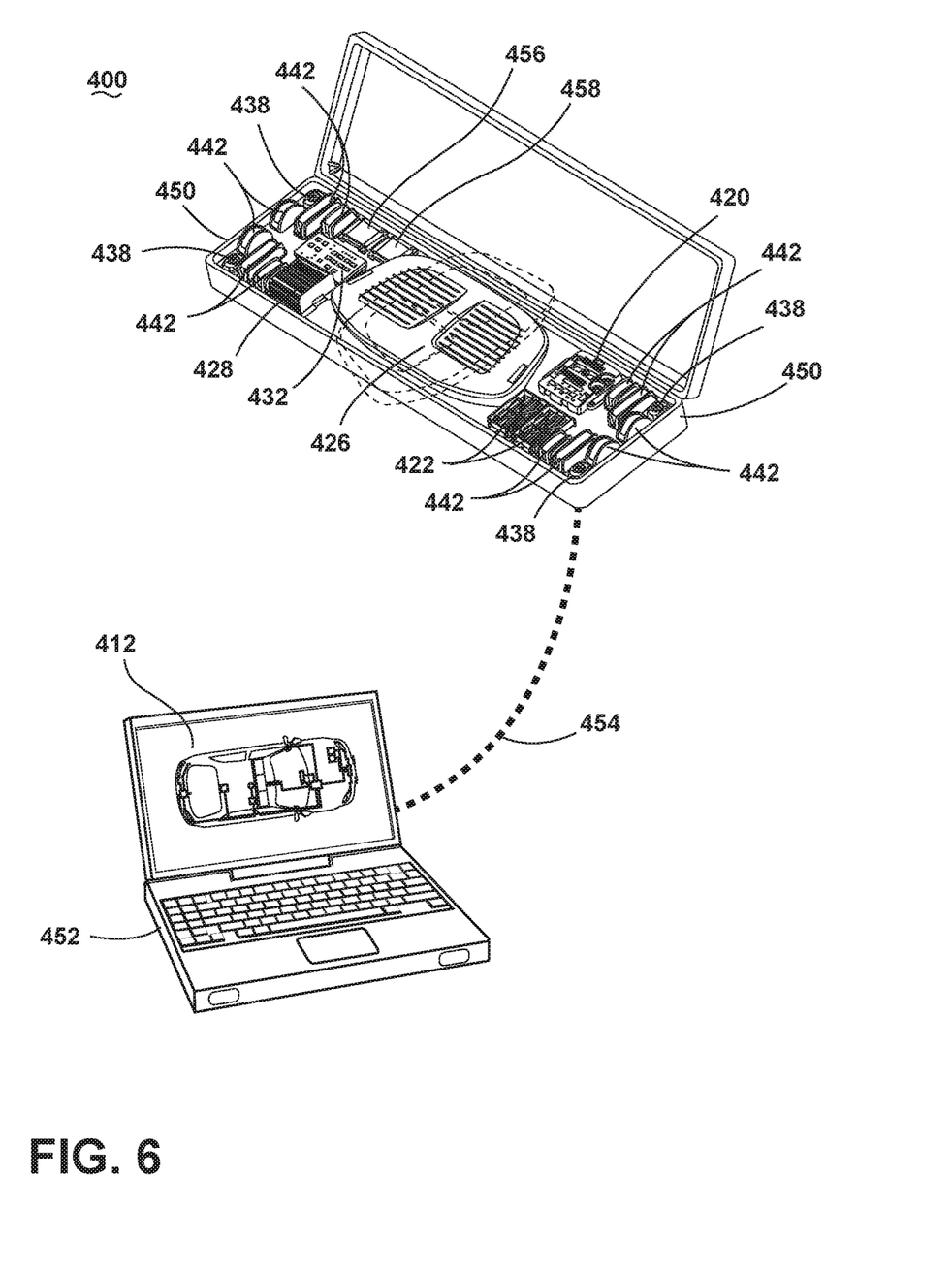
FIG. 6 is a schematic view of a system for simulating an emergency vehicle with a modular, networked control system according to an embodiment of the invention and as described in FIGS. 1-5.

Referring now to FIG. 6, a perspective view of a portable emergency vehicle demonstration system 400 for simulating an emergency vehicle with a modular, networked control system according to an embodiment is shown. With respect to the emergency vehicle control system, including the controllers and the functional warning units, the embodiment is similar to the embodiment presented above particularly with respect to FIG. 1; therefore, like parts will be identified with like numerals increased by 400, with it being understood that the description of the like parts of the previous embodiment applies to the current embodiment, unless otherwise noted.

The portable emergency vehicle demonstration system 400 includes an enclosure 450 having a base and a cover mounted to the base, wherein the cover is movable between an opened and closed position, and containing one or more functional warning units and at least one central controller 420 connected to the one or more functional warning units with an included power supply for the central controller (typically producing 12 to 24 VDC). In one example configuration, the enclosure 450 can be dimensioned such that the enclosure 450 is less 1.30 meters long, less than 0.38 meters wide, and less than 0.15 meters tall. While "long, wide, and tall" are described, it is understood that the particular dimensions can be based on the relative orientation of the enclosure 450, and thus, for example, a width dimension in one orientation can be interchangeable with a length dimension in another orientation. The functional warning units in the enclosure 450 may include any of the above-described active visual and audible warnings, such as a lightbar 426, a siren 428, headlight flashers 438, perimeter lighting 442 etc. The perimeter lighting 442 can include, for example, functional or representative tail lights for an emergency vehicle. Other active functional warning units may be integrated into the enclosure 450 depending upon the specific configuration of the simulated emergency vehicle 412. Other active warning functional units may include public address systems, air horns, and load lights, dash lights, traffic arrows etc.

Functional representation of a vehicle with the portable emergency vehicle demonstration 400 may include complete containment of the physical elements located with the enclosure 450 for storage and transit. Stated another way, the physical elements located with the enclosure 450 can be contained within the enclosure 450 when the enclosure cover and base are in the closed position. The enclosure 450 can further include a handle, for example, configured to support the weight of the enclosure 450 and internal elements when the cover is in the closed position, such as for transport. Certain elements may also require the enclosure 450 to include mechanical pivots or orientation movements for the elements contained therein. The enclosure 450 may include components to cause mechanical movement of the warning signal components where the mechanical movement may include translation, rotation, elevation etc. or any movement that articulates the components to represent the orientation of the components in an actual vehicle configuration. For example, in FIG. 6, the lightbar 426 may rotate 90 degrees as shown in dotted form. In this sense, the lightbar 426 is movable from a first position, for example, configured to store or transport the portable system 400, to a second position representative of a lightbar configuration on an emergency vehicle. Likewise, any other element located within the enclosure 450 may rotate or articulate within the enclosure 450, depending upon the implementation.

Externally connected to the enclosure 450 and functionally connected to at least the central controller 420, a device 452 capable of providing an HMI simulates and displays or visualizes a simulated emergency vehicle 412 and its functional responses to a real-world environment as well as provide feedback regarding the operation of the emergency vehicle control system elements housed within the enclosure 450. The device 452 is in the form of a laptop computer.

The central controller 420 provides sufficient power (i.e. voltage, current) and physical wiring connections to any signaling components such that the controller 420 integrated into the portable emergency vehicle demonstration 400 not only simulates (e.g. induce failures to wiring, low/high voltage and current supplied, programming, etc for training purposes) and supports troubleshooting potential for vehicle installation fault conditions, but also detects failures and faults. The central controller 420 is configured to sense failures and to send corresponding fault and health status to a human-machine interface panel, either the human-machine interface device 452, the control panel 432, or other device local or remote (via, for example an internet connection). In addition, and alternatively, the information may be stored for download at a later time by maintenance personnel, or with a microprocessor-based device 452 may be directly be transmitted to a remote user or networked monitoring system.

The device 452 controlling and displaying the simulated emergency vehicle may be a laptop, a smart phone or tablet—networked with the system 400 either wired or wirelessly. For example, as shown in the figure, the device 452 is a laptop computer configured to be communicatively coupled to the emergency vehicle control elements located in the enclosure 450 by a universal serial bus (USB) connection 454. Any device capable of providing an HMI may be used to interface an operator of the simulator with the emergency vehicle control system in the enclosure 450. Other devices for providing HMI may include a purpose-built touch panel device specifically for emergency vehicles or a multi-button console control head.

Additional elements of the control system may include an input node 456 and a breakout box 458. Recall that the control system is configured to be responsive to additional inputs that provide alternative conditions such that system may initiate signaling patterns in response to the current state of, for example, the ignition switch or any of the emergency functional warning units. In some implementations, a breakout box 458 may extend the functionality of the control system by enabling additional components to be coupled to the network. For example, an emergency vehicle may be simulated with a smart bumper that includes auxiliary lighting and controls. The breakout box 458 may provide the additional interconnects necessary to include the smart bumper inputs and functional warning units into the control system.

Just as in the embodiment wherein the control system is integrated into an emergency vehicle to control and coordinate the active warning devices, a modular networked control system integrated into the enclosure 450 may further include a central controller 420 communicatively coupled to one or more remote controllers 422 via a self-contained network connection that can include a Local Interconnect Network (LIN) 24. Other networks, for example, may include a Controller Area Network (CAN) or a wireless local area network (WLAN).

The enclosure 450 and the control system provided therein includes the functional warning units along with the communication interconnects (e.g. the LIN, the central controller 420 and one or more remote nodes 422) necessary to represent an emergency vehicle. Software provided in the HMI device 452 can be configured to provide an interface to control and manipulate the elements contained in the enclosure 450 to provide a simulation of an emergency vehicle 412. In this way, an operator of the device 452 may demonstrate and experience the results of a live configuration with actual system components.

In one embodiment, the simulated control system can provide a tool for Hardware-in-the-Loop (HWIL) development. A suite of functional warning units along with the controllers for operating them are subject to direct evaluation and testing. The portable emergency vehicle demonstration system 400 can be configured to provide an integrated logic controller test and output evaluation for myriad combinations of control interface. Beneficially, the HWIL development system can be used to decrease the development cycle time over a conventional control system development without the need for installation in a vehicle. Additionally, the HWIL system can be configured to provide direct feedback for system-level troubleshooting.

The portable emergency vehicle demonstration system 400 is a training and demonstration tool that quickly enables technicians, sales force, and end users to experience and train on the control system. Installation of conventional emergency vehicle controls systems is time intensive where learning to correctly operate the systems can be difficult and complex. However, the portable emergency vehicle demonstration system 400 can standardize programmable system deployments to fleets, potentially across departments and across agencies. In addition to enabling a standard configuration and training procedure across a fleet, the portable emergency vehicle demonstration system 400 can enable a fleet-wide augmentation of emergency vehicle lighting and strobe pattern strategies without the need for rewiring the fleet assets.

The system for simulating a vehicle's signaling functions is able to operate physical samples of signaling technology, allowing users to view actual light, sound, or data patterns generated. Many of the actual signaling devices must conform to standards such as visual light pattern required outputs such as FMVSS (Federal Motor Vehicle Safety Standards), SAE J845, SAE J595, and California Title 13, and thus are not readily simulated by a two-dimensional computer screen graphical representation of the signaling device. Many of the signaling devices have microprocessor controlling functions in the devices themselves, for example, small perimeter light assemblies, which have performance affected by small voltage, current, or encoded data line information. Simulation of actual hardware samples can reveal, troubleshoot, and avoid potential vehicle integration problems before the installation and permanent vehicle modification begins.

Figure 7:
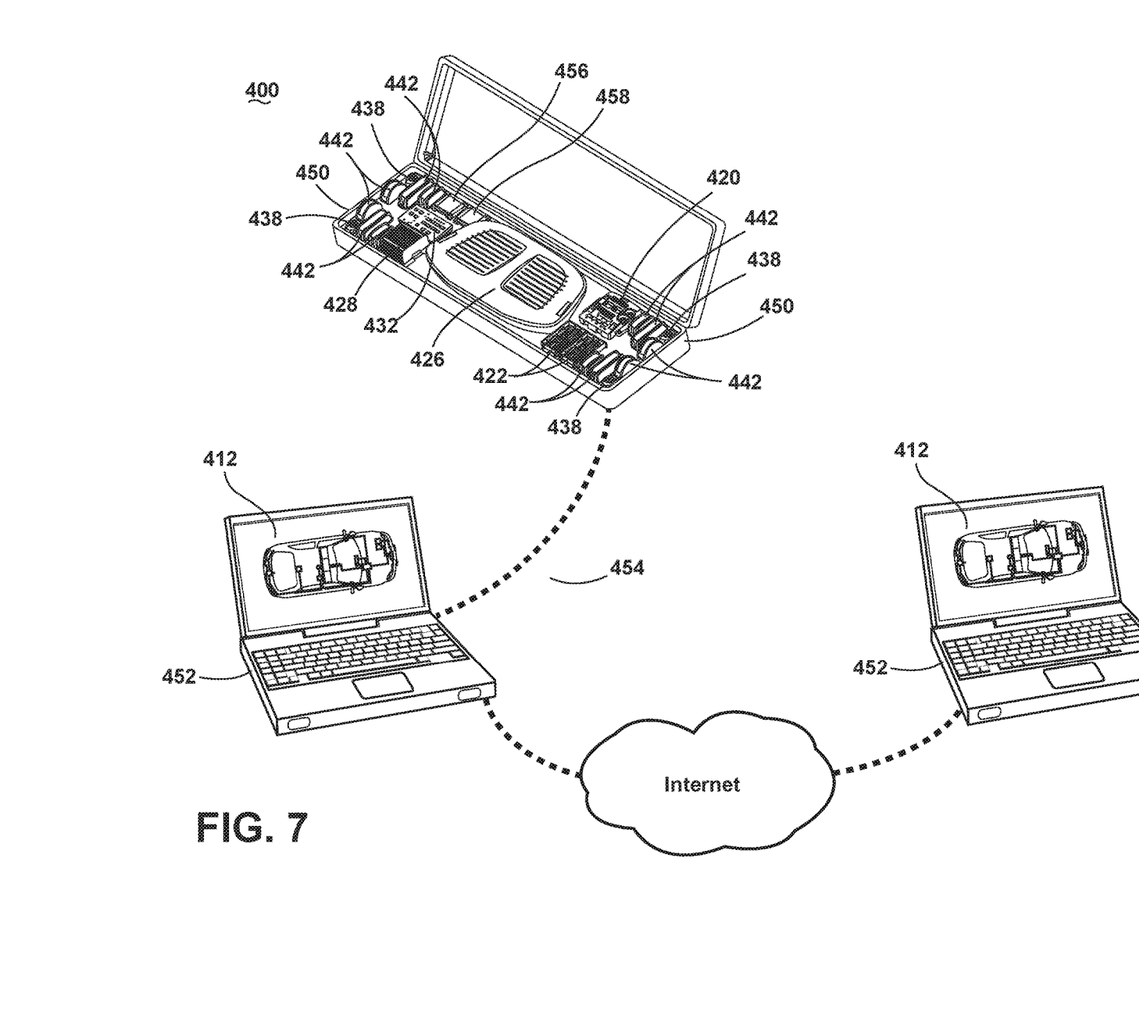
FIG. 7 is a view of a system for simulating an emergency vehicle via a remote user wherein a microprocessor-based device connects to a central controller of the simulator system of FIG. 6 via an internet connection to a second user according to an embodiment of the invention.

The central control function can be coordinated by users located locally (i.e. directly witnessing the desired functionality) or remotely coordinated (i.e. by a remotely located user with a similar simulator system where both are interactively coordinated by internet connectivity). Referring now to FIG. 7, where like numerals are used to identify like parts, a system for simulating an emergency vehicle via a remote user wherein a microprocessor-based device connects to the central controller of the simulator system via an internet connection to a second user according to an embodiment is shown.

Figure 8:
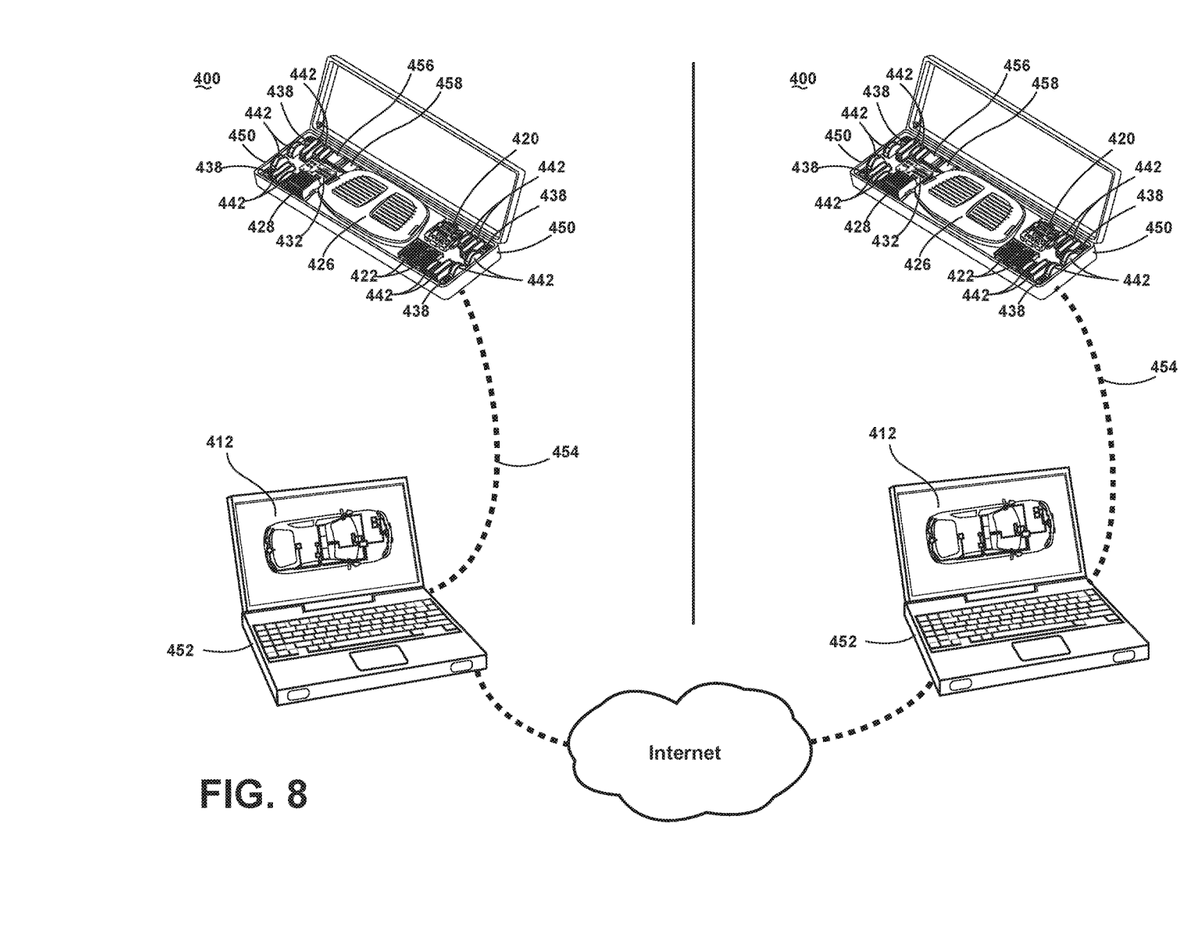
FIG. 8 is a view of a system for simulating an emergency vehicle via a remote simulator wherein a microprocessor-based device connects to a central controller of the simulator system via an internet connection to a separate simulator system according to an embodiment of the invention.

Referring now to FIG. 8, where like numerals are used to identify like parts, a system for simulating an emergency vehicle via a remote simulator wherein a microprocessor-based device connects to a central controller of the simulator system via an internet connection to a separate simulator system according to an embodiment is shown. In this configuration, the connectivity provided by the remote connection enables the exchange of programming data and configuration files. In this way, the simulator system enables a user to remotely control from one side to the other, or mirror functionality between system instantiations equally.

In this way, the simulator system enables large fleets of vehicles to have predictably standardized functionality and adherence to mandatory regulations and policies. The simulator system enables the evaluation and refinement of newer, emerging on-vehicle signaling technology prior to installation. Another aspect includes extension of the simulator system to connectively couple the central controller of a fully installed vehicle to one or more additional microprocessor-based devices. In this way, the simulator system enables deployed fleet vehicles to have live control interactions with a central station or directly to a nearby vehicle.

Figure 9:
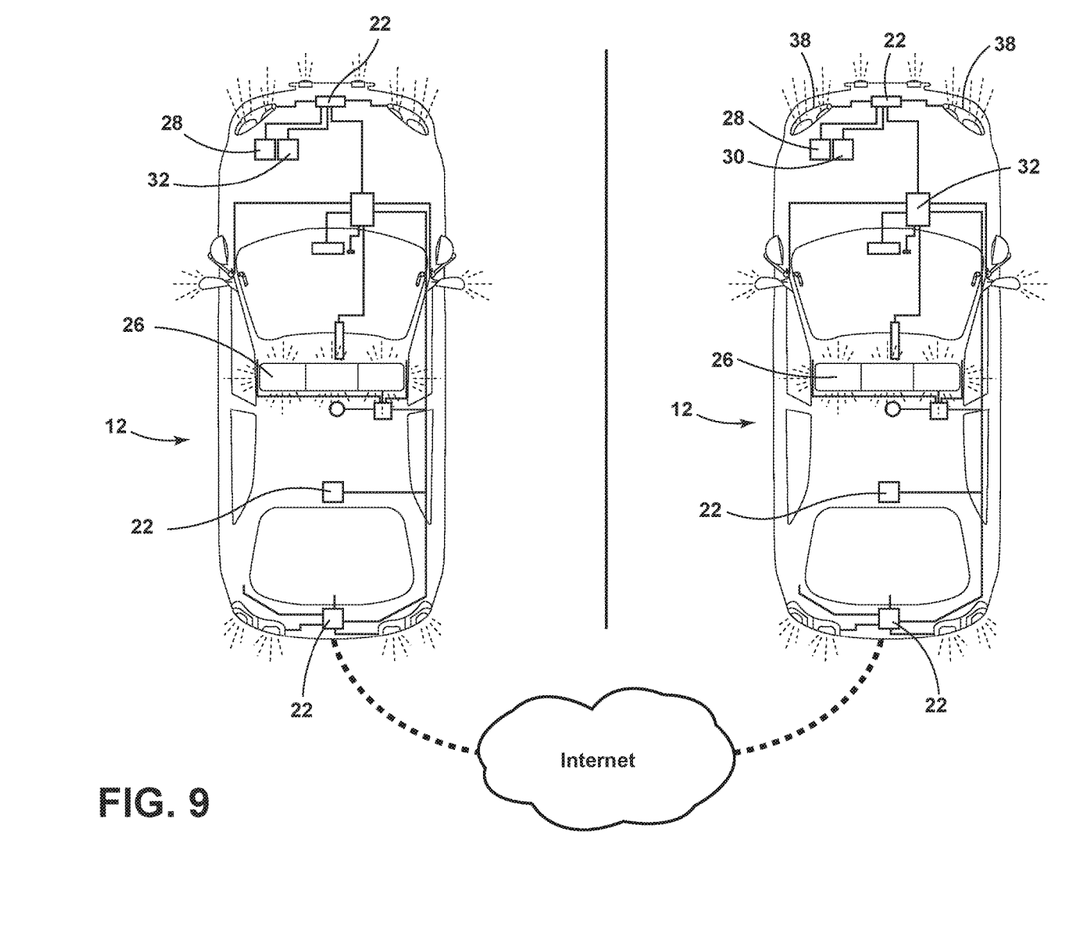
FIG. 9 is a view of a system for simulating an emergency vehicle wherein a microprocessor-based device connects to a central controller of a first emergency vehicle and connects via an internet connection to a separate vehicle system according to an embodiment of the invention.

Referring now to FIG. 9, a view of a system for simulating an emergency vehicle wherein a microprocessor-based device connects to a central controller of a first emergency vehicle and connects via an internet connection to a separate vehicle system according to an embodiment is shown. The simulator system is extensible to multiple installed emergency vehicle control systems. The microprocessor-based device that connects to the central controller of a first vehicle connects via internet connection to a separate simulator or vehicle system or central network located station to enable, among other things, the exchange of programming data and configuration files and system maintenance/fault information. The central network located system coordinates interaction between vehicles. An operator, with proper network permission and privileges, may interface with signaling systems on multiples vehicles by any of an onboard human-machine interface, a remote location interface, or vehicle-to-vehicle communication. For example, a multiple car pursuit may include automatically controlled lighting strategies dictated in part by predetermined programmable configuration parameters stored by a vehicle central controller.

It is envisioned a simulator system as described herein may be configured to advantageously represent many different types of vehicles and their respective signaling system components (e.g. police, fire, ambulance, trucks, busses, agriculture equipment, airport equipment, watercraft, etc.)

While the invention has been specifically described in connection with certain specific embodiments thereof, it is to be understood that this is by way of illustration and not of limitation. Reasonable variation and modification are possible within the scope of the forgoing disclosure and drawings without departing from the spirit of the invention which is defined in the appended claims.

What is claimed is:

1. A portable emergency vehicle demonstration system, comprising:
    an enclosure having a base and at least a partial cover mounted thereto, wherein the cover is movable between an opened position and a closed position;
    a set of functional warning units arranged within the enclosure, wherein an arrangement of the set of functional warning units represents an emergency vehicle; and
    a controller arranged within the enclosure and configured to operate the set of function warning units according to a set of predetermined signaling patterns;
    wherein the enclosure includes a front a front portion, a middle portion, and a rear portion, and the set of functional warning units includes a headlight, a light bar, and a tail light, and wherein the front portion includes the headlight, the middle portion includes the light bar, and the rear portion includes the tail light.

2. The portable emergency vehicle demonstration system of claim 1 further comprising a networked device external to the enclosure and communicatively coupled with the controller.

3. The portable emergency vehicle demonstration system of claim 2 wherein the networked device includes a visual representation of an emergency vehicle.

4. The portable emergency vehicle demonstration system of claim 3 wherein the visual representation of the emergency vehicle includes a visual representation of the set of functional warning units.

5. The portable emergency vehicle demonstration system of claim 4 wherein the networked device is configured to instruct the controller to operate at least one of the set of predetermined signaling patterns while contemporaneously operating a same predetermined signaling pattern on the visual representation of the set of function warning units.

6. The portable emergency vehicle demonstration system of claim 2 wherein the networked device comprises at least one of a laptop, a smart phone, or a tablet.

7. The portable emergency vehicle demonstration system of claim 2 wherein the networked device is networked by way of a wired or wireless communication network.

8. The portable emergency vehicle demonstration system of claim 7 wherein the networked device is networked by way of the Internet.

9. The portable emergency vehicle demonstration system of claim 2 wherein the networked device is simultaneously networked with a first controller having a first set of functional warning units and a second controller having a second set of functional warning units.

10. The portable emergency vehicle demonstration system of claim 9 wherein the networked device operably controls the first and second controllers to operate a common predetermined signaling pattern on the respective first and second sets of functional warning units.

11. The portable emergency vehicle demonstration system of claim 9 wherein the networked device operably controls the second controller to operate at least one of the set of predetermined signaling patterns in response to the first controller operating at least one of the set of predetermined signaling patterns.

12. The portable emergency vehicle demonstration system of claim 1 further comprising a self-contained network coupling the controller with the set of functional warning units, wherein the self-contained network is configured to communicate at least one network message generated in the controller to the set of functional warning units.

13. The portable emergency vehicle demonstration system of claim 12 wherein the self-contained network is at least one of a local interconnect network (LIN), controller area network (CAN), or wireless local area network (WLAN).

14. The portable emergency vehicle demonstration system of claim 12 wherein the controller is further configured to generate a desired state of the set of functional warning units and encode the desired state into a packet, and the encoded packet is delivered to the set of functional warning units by way of the self-contained network.

15. The portable emergency vehicle demonstration system of claim 14 wherein the set of functional warning units are configured to parse the desired state of each respective functional warning unit in the encoded packet, and set the state of each of the set of functional warning units based on the parsed encoded packet.

16. The portable emergency vehicle demonstration system of claim 1 further including an input configured to generate a set of simulated vehicle state inputs and provide the simulated vehicle state input to the controller.

17. The portable emergency vehicle demonstration system of claim 16 wherein the controller is further configured to operate the set of function warning units in response to the simulated vehicle state input.

18. The portable emergency vehicle demonstration system of claim 1 wherein the set of functional warning units includes a lightbar representative of an emergency vehicle lightbar.

19. The portable emergency vehicle demonstration system of claim 18 wherein the lightbar is movable between a first position for transporting the demonstration system and a second position representative of a lightbar configuration on an emergency vehicle.

20. The portable emergency vehicle demonstration system of claim 19 wherein the lightbar is movable to a second position oriented relative to a front portion of the enclosure and a rear portion of the enclosure, such that the front portion, lightbar, and rear portion visually correspond with an emergency vehicle.

21. The portable emergency vehicle demonstration system of claim 1 wherein the set of function warning units includes at least one of a visual signal, an audible signal, a lightbar assembly, a siren, a directional lighting element, a headlight, a perimeter lighting element, a public address system, an air horn, a load light, a set of dash light, or a traffic arrow.

22. The portable emergency vehicle demonstration system of claim 1 wherein the enclosure includes a handle configured to support the enclosure when the cover is in the closed position.

23. The portable emergency vehicle demonstration system of claim 1 wherein the enclosure is less than 1.30 meters long, less than 0.38 meters wide, and less than 0.15 meters tall.

24. A portable emergency vehicle demonstration system, comprising:
an enclosure having a base defining a front portion, a middle portion, and a rear portion, and at least a partial cover mounted thereto, wherein the cover is movable between an opened position and a closed position;
a set of functional warning units arranged within the enclosure, the set of functional warning units including at least a headlight, a light bar, and a tail light, wherein the arrangement of the set of functional warning units represents an emergency vehicle, and wherein the lightbar is adapted to be movable between a first position for transporting the demonstration system and a second position representative of a lightbar configuration on an emergency vehicle; and
a controller arranged within the enclosure and configured to operate the set of function warning units according to a set of predetermined signaling patterns;
wherein the front portion includes the headlight, the middle portion includes the light bar, and the rear portion includes the tail light such that the front portion, middle portion, and rear portion are adapted to visually correspond with an emergency vehicle.

* * * * *